Figure 1:
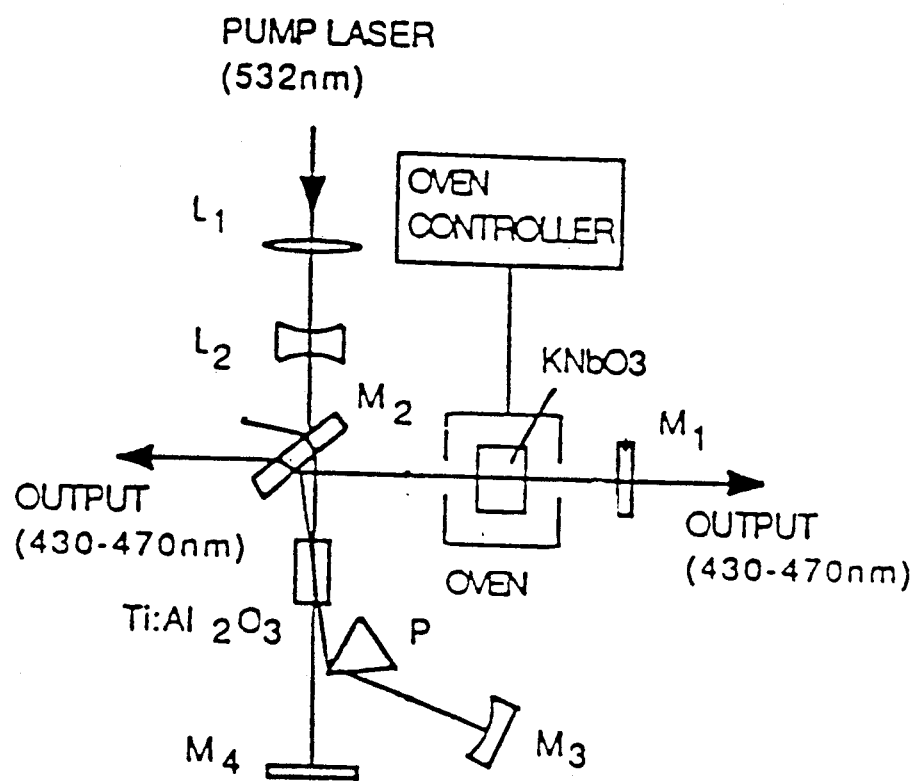

United States Patent [19]

Günter

[11] Patent Number: 5,034,949
[45] Date of Patent: Jul. 23, 1991

[54] POTASSIUM NIOBATE CRYSTALS PROCESS FOR THEIR PREPARATION AND LASER COMPRISING THEM

[75] Inventor: Peter Günter, Riedt/Neerach, Switzerland

[73] Assignee: Sandoz Ltd., Basel, Switzerland

[21] Appl. No.: 431,258

[22] Filed: Nov. 3, 1989

[30] Foreign Application Priority Data

Nov. 5, 1988 [DE] Fed. Rep. of Germany ....... 3837672

[51] Int. Cl.⁵ .............................................. H01S 3/10
[52] U.S. Cl. ....................................... 372/21; 307/425
[58] Field of Search .................... 372/21, 22; 307/425

[56] References Cited

U.S. PATENT DOCUMENTS

| | | | |
|---|---|---|---|
| 3,417,032 | 12/1968 | Bonner et al. | 252/518 |
| 3,420,776 | 1/1969 | Hepplewhite et al. | 252/62.9 |
| 3,423,686 | 1/1969 | Ballman et al. | 330/4.5 |
| 3,428,438 | 2/1969 | Andres et al. | 23/301 |
| 3,440,025 | 4/1969 | Landies et al. | 23/301 |
| 3,565,577 | 2/1971 | Nassau et al. | 23/20 |

Primary Examiner—Léon Scott, Jr.
Attorney, Agent, or Firm—Gerald D. Sharkin; Richard E. Vila; Melvyn M. Kassenoff

[57] ABSTRACT

Single domain crack-free and striation-free $KNbO_3$ crystals having a maximum iron content of 15 ppm, a process for the synthesis of such crystals and laser systems comprising single domain crack-free and striation-free $KNbO_3$ crystals which systems convert green light of wavelength 500–540 nm into blue light of wavelength 430–490 nm.

20 Claims, 1 Drawing Sheet

POTASSIUM NIOBATE CRYSTALS, PROCESS FOR THEIR PREPARATION AND LASER COMPRISING THEM

According to the invention, there is provided a $KNbO_3$ single domain, crack-free and striation-free crystal having an iron content of 15 ppm or of less than 15 ppm. Preferably the amount of iron present is 2 to 15 ppm.

Up until now it has not been possible to produce a $KNbO_3$ crystal having iron impurities in an amount as low as 15 ppm. Crystals that have been available to date appear to have an iron content of about 50 ppm.

The crystals according to the invention have an absorption loss (of light of wavelength 1.06 $\mu$m) of less than 1% when passing through 1 cm of crystal.

The refractive index of such a crystal is substantially the same, i.e. uniform over the length of the crystal, the variation in refractive index being less than $10^{-5}$ per cm length of crystal.

Crystals according to the invention can produce a half width of temperature phase matching curves, of light of wavelength 840 nm, of about 0.3° C. in a 1 cm long crystal. This is important as it allows good reinforcement of second harmonics that can be generated in the crystal.

In a crystal according to the invention, the variation in conversion efficiency to form a second harmonic from a fundamental is practically negligible, e.g. is ±5% over 1 cm length of crystal for a wave width of about 200 $\mu$m. This is important because it allows good second harmonic reinforcement and enables the second and fundamental waves to be kept in phase.

One very surprising advantage of a crystal according to the invention is that the peak damage threshold of uncoated $KNbO_3$ crystals has been significantly increased to a value, for example, of greater than 1.2 $KW/cm^2$ of the surface of the crystal at a wavelength of 1.06 $\mu$m.

A crystal according to the invention preferably has a hardness of about 5 Mohs, lattice parameters of $a = 5.6896 \times 10^{-10}$m, $b = 3.9692 \times 10^{-10}$m and $c = 5.7256 \times 10^{-10}$m and a density of about 4.62 g/cms$^3$.

A crystal according to the invention preferably has a melting point of from 1050°–1060° C. It preferably also has structural phase transitions of −50° C., +225° C. and +430° C.

In producing a good crystal according to the invention, it is important to polish it carefully.

Polishing should be carried out to produce a good surface homogeneity that hardly differs across the surface, e.g. of less than $\lambda/10$ where $\lambda$ is the wavelength in meters and so that two opposite surfaces are substantially parallel, for example that the difference in parallelity is less than 1/180 of a degree.

Further according to the invention, there is provided a process for preparing a $KNbO_3$ crystal comprising
(a) mixing in a water-free system 50.5 to 54 mol percent of anhydrous $K_2CO_3$ with 46 to 49.5 mol percent $Nb_2O_5$, sintering the mixture at a temperature of 750°–850° C. and then heating to at least melting to form a molten flux seeding solution,
(b) seeding the solution; and
(c) polishing the resultant seeded crystal.
Preferably step (a) comprises:

(i) mixing 50 percent of anhydrous $K_2CO_3$ with 50 mol percent of $Nb_2O_5$ in powder form and homogenising the mixture;
(ii) sintering at 750°–850° C.;
(iii) crushing the sintered material into powdered form and homogenising;
(iv) sintering in the presence of excess water-free $K_2CO_3$ (anhydrous); so that the final percentages of $K_2CO_3$ is 50.5 to 54 mol % and the final molar percentages to $Nb_2O_5$ is 49.5 to 46% mol %;
(v) crushing the sintered material in powdered form; and
(vi) pouring the mixture into a container of an inert material (preferably a platinium crucible) and heating the mixture to melting or just over its melting point to form a molten flux seeding solution.

Preferably the temperature of the flux is 1050° to 1060° C.

Step (b) is preferably a top seeded solution growth variation of the Czochralski method.

More preferably step (b) comprises
(i) inserting, whilst rotating, a $KNbO_3$ seed which is commercially available having orientation (110) or (100) (rotating preferably at a constant value in the range of 15–30 revs/min) into the upper regions of the molten flux seeding solution; whereby the temperature of the flux is regulated so that the weight of the seed does not increase by more than 0.1 g over the first 6 to 12 hours (preferably 6 hours);
(ii) changing the temperature of the flux (preferably decreasing the temperature) to cause the crystal to be drawn at a rate of crystal growth of not more than 0.5 mm per hour; (preferably the temperature is decreased by not more than 0.3° C. per hour until the flux temperature is reduced by 5° or 6° C.);
(iii) once the crystal has reached the weight required, withdrawing the crystal from direct contact with the melt and cooling at a constant temperature gradient (e.g. 30° C. per hour) (from the top to the bottom of the crystal) to room temperature.

Step (c) is then preferably carried out by
(i) grinding all surfaces of the crystal;
(ii) placing the crystal for 1 hour in 30% liquid hydrofluoric acid at 80° C.;
(iii) washing the crystal in cold water;
(iv) where necessary, realigning by means of a Laue (X-ray) diagram any spontaneous polarisation on the b-surfaces caused through grinding;
(v) grinding the surfaces again and realigning any spontaneous polarisation;
(vi) then cutting the crystal (preferably with a diamond saw) to its required size;
(vii) grinding the a- and c- surfaces again;
(viii) surface grinding the a- and b- surfaces to maximum transparency;
(ix) submerging the crystal in an inert liquid or gas (preferably silicon oil or in pure oxygen or in air), heating to 120°–200° C. and then applying a 0.5 to 5 KV/cm field to the c-axis surfaces to remove any domains that come about due to polishing; very finely polishing all surfaces.

One result of the development of the crystals according to the invention is that it has enabled a laser system to be developed that can convert green light into blue light.

Further according to the invention, there is provided a laser system containing a single domain, crack-free and striation-free $KNbO_3$ crystal (preferably having an iron content of less than 15 ppm), which system converts green light (preferably wavelength of 500–540 nm) into blue light (of wavelength between 430 and 470 nm).

Preferably such a laser system comprises (i) a Ti:Al$_2$O$_3$ crystal-containing, pumped laser system for converting green light to infra-red light (of a wavelength in the range 860–940 nm);

(ii) means for introducing green light into the Ti:Al$_2$O$_3$ (laser) crystal;

(iii) downstream of the Ti:Al$_2$O$_3$ crystal, a single domain, crack-free and striation-free KNbO$_3$ crystal (preferably according to the invention) located in an oven for heating the KNbO$_3$ crystal for phase matching of the second harmonic with its fundamental; and (iv) means for introducing only infra-red light of a specified wavelength from the Ti:Al$_2$O$_3$ crystal into the KNbO$_3$ crystal where the infra-red light is converted to blue light by frequency doubling.

Preferably such a laser system is in a single cavity or container.

Preferably green light is introduced into the Ti:Al$_2$O$_3$ crystal from a Q switched Nd:YAG laser (emitting light of wavelength 532 nm, for example the laser B.M. Industries Model 501-D.NS); from an Argon-laser (emitting light of wavelength 514.5 nm), both lasers operating at 30 HZ, the pulses having energies of up to 18 mJ and a typical pulse width of 20 ns or from an adjustable laser diode.

The collimated beam that results often has too wide a band width (e.g. 10 mm) and this can be reduced (e.g. to 1 mm) by a suitable system of lenses.

The Ti:Al$_2$O$_3$ laser is then pumped with the second harmonic from the green light and passes through the Ti:Al$_2$O$_3$ crystal, where preferably the light passes to a prism.

In order to tune out any undesired wavelengths preferably an optical resonator is set up. This functions by creating a pathway for I.R. light generated in the Ti:Al$_2$O$_3$ crystal to a prism, where the various different wavelengths of I.R. light produced by the Ti:Al$_2$O$_3$ crystal are diffused. By judicious adjustment of a concave mirror downstream of the prism in the resonator only I.R. light of the desired wavelength is passed down the pathway to the KNbO$_3$ crystal.

In order to avoid damage of the prism, it is useful to use a paraxial pumping system where the intersection of the angle of pumping with the resonator axis is about 15° inside the Ti:Al$_2$O$_3$ crystal.

This beam of I.R. light of specified wavelength is then passed into the KNbO$_3$ crystal, which by appropriate heating allows the second harmonic generated blue light to be brought into phase with the fundamental.

The definition of the a-, b- and c- axes can be found in Ferroelectrics 6, p 263–281 in an article by E. Wiesendanger.

The invention will now be illustrated by the following Examples.

EXAMPLE 1

19.19 g of pure, water-free finely divided powdered K$_2$CO$_3$ (PA, Fluka) and 36.92 g of pure, water-free, finely divided powdered Nb$_2$O$_5$ are mixed in a suitable container for 16 hours with a rotor rotating at 30 rpm.

The mixture is then poured into a platinum crucible which is then placed in a sintering oven. The mixture is then heated to 820° C. and left in the oven for 6 hours at this temperature, after which it is taken out of the oven and cooled to room temperature. The net weight (including crucible of 144.35 g) is 195.85 g. The slightly clumpy powder mixture is stirred with a spatula and the clumps of material are crushed into a fine powder. The crucible (with mixture) is sintered a further six hours at 820° C. After cooling, the mixture is crushed again and mixed with 0.9 g of pure, water-free, fine powder K$_2$CO$_3$.

The seed for crystallisation is a KNbO$_3$ rod-shaped crystal with an orientation (110) or (100) and is 3.5×3.5×15 mm. It is carefully attached with a fine platinium wire to a crystal support and is positioned on a balance arm over the flux melt and the seed is brought into a position from which it can be lowered into the upper regions of the flux melt.

The platinum crucible is treated in an oven (as described in the article by Wu Xing et al "Progress in KNbO$_3$ Crystal Growth" in Journal of Crystal Growth 78 (1986) p. 431–437). The temperature of the mass is raised over 18 hours to 1° to 3° C. above the melting point of the KNbO$_3$ crystal (1050° to 1060° C.) and the crystal seed (whilst continuous rotating at 30 rpm until the termination of crystal growth) is then lowered into the upper regions of the melt flux (controlled visually with assistance fron the balance arm). The crucible is rotated intermittently in the same direction as the crystal seed but at varying speeds. First, it is rotated slowly and this is then increased to about 20 rpm, then for about 20 seconds the crucible rotation and the speed of the seed are the same (30 rpm) and then the crucible is slowly brought to a standstill. When that is reached, the sequence of variating rotation starts again after 20 seconds.

After the seed portion in contact with the melt flux has become molten, the temperature of the melt is reduced so that over the first 6–12 hours, the weight of the seed increases by around 0.1 g. However, if the seed becomes too heavy in this time period, the temperature must be slightly raised to cause a part of the seed to become molten again and if the seed is too light then the temperature is slightly decreased.

After this first 6–12 hours are passed, the temperature of the melt is slowly reduced at a rate of 0.03° C. per hour over the next 6–12 hours. Crystal formation then starts. The rate of growth of the seed is about 0.5 mm per hour. Before the crystal grows onto the crucible side, the rate of temperature decrease is slowed down.

Once the crystal has reached the required dimensions, it is separated by beging withdrawn a few mms above the surface of the flux Cooling then begins. Down to a temperature of about 480° C., the crystal is cooled starting at a rate of about 30° C. per hour and progressing more slowly later so that room temperature is reached after 3 days.

Cooling of the crystal is on a temperature gradient so that the upper region of the crystal is always a little cooler than the lower regions of the crystal.

Once the crystal reaches room temperature, the crystal is removed from the crystal support by removal of the platinium wire. The resultant rough crystal is then ground on all natural surfaces (including additional facets of the crystal), immersed for 1 hour in a Teflon container in 30% hydrofluoric acid at 80° C., washed with cold water and dried.

With the aid of an etch pattern seen under a microscope, the b-surfaces and spontaneous polarisation can be determined. By means of a Laue (X-ray) diagram, the b-surfaces can be oriented, ground and the facing b-surfaces are then finely surface ground.

The crystal is then separated from the seed by using a diamond saw along c-axis and is cut into the desired crystal sizes.

From each piece of crystal, a- and c- surfaces are oriented (using a Laue diagram or a Bragg Reflexion). The surfaces are then ground and the opposite faces finely surface ground. All a- and b- surfaces are then polished to transparency and the c-surfaces are ground fine.

Each piece of crystal is then immersed in silicon oil (or in oxygen or air), heated to 120°-200° C. and a 0.5 to 5 KV/cm field is exerted across the c-axis surfaces to remove any domains that might be present. The c-axis surfaces are then polished to the desired fineness.

EXAMPLE 2

The $KNbO_3$ crystal, cut to a size $a \times b \times c = 7.9 \times 7.6 \times 8.8$ mm, can be used in a frequency doubling and tunable blue laser as shown in FIG. 1.

Green light of 532 nm is introduced from a Q-switched Nd: YAG laser (BM Industries Model 501-D.N.S) operating at 30 HZ to a $Ti:Al_2O_3$ laser through two lenses, $L_1(f=300$ m$)$ and $L_2(f=-30$ mm$)$, so that the collimated pump beam is reduced from 10 mm to 1 mm.

The green light is converted to I.R. light in the $Ti:Al_2O_3$ laser. A mirror $M_4$ is used to pump back residual pump light (green light) into the $Ti:Al_2O_3$ crystal to increase efficiency in I.R. light conversion.

The I.R. light is pumped to a prism P in an optical resonator system. In order to avoid laser damage of the prism, a paraxial pumping scheme is used. The intersection angle of the pump beam with the resonation axis is about 15° inside the laser crystal.

The optical resonator is a stable two fold cavity of 0.3 m length with two flat mirrors $M_1$ and $M_2$ and a concave mirror $M_3$ of 0.5 m radius of curvature. All mirrors are highly reflective ($R > 98\%$) from 700 nm to 1000 nm (That is to say they reflect I.R. light) while $M_2$ has a high transmission for both 532 nm (green light) and the second harmonic wave ($T > 85\%$).

Prism P, operated at the Brewster angle, enables dispersion of the I.R. light so that by judicious tuning of mirror $M_3$ only the fundamental wave of I.R. light of a specific wavelength is reflected through the optical resonator.

The $Ti:Al_2O_3$ laser crystal (10 mm) is grown by the Czochralski method and has a nominal doping of 1%. The crystallographic b-axis is parallel to the resonator axis and the c-axis is horizontal like the polarisation of the pump beam. A.R. coatings for both 532 nm and the laser operating range are deposited on the polished (010)- and (010)-faces.

I.R. light from the optical resonator is reflected off mirror $M_2$ into the $KNbO_3$ crystal ($a \times b \times c = 7.9 \times 7.6 \times 8.8$ mm). The polished faces have a single layer AR-coating for 860 nm. The $KNbO_3$ crystal is mounted in an oven with the a-axis parallel to the resonator axis. The c-axis is vertical to allow to type I phase matched second harmonic generation by the non-linear coefficient $d_{32}$. Using temperature tuning, two tunable blue beams are generated in opposite directions along the $KNbO_3$ crystal and by having $M_1$ reflecting the blue light an enhanced blue light signal is emitted through mirror $M_2$ which transmits blue light (430-470 nm)(designated as OUTPUT).

The temporal pulse shape and pulse to pulse stability is measured using a fast photodiode (MRD-500 tire) and a Tektronix 7904 oscilloscope. The time resolution is less than 1 nanosecond. The infrared and SH pulse lengths are typically 35 nanoseconds and 30 nanoseconds. No significant pulse compression is observed in the second harmonic generation process.

By heating the $KNbO_3$ crystal from room temperature to 180° C., phase matching is obtained for fundamental waves of 860 nm to 940 nm. By tuning the $Ti:Al_2O_3$ laser and prism to appropriate fundamental wavelength and heating the $KNbO_3$ crystal to the phase matching temperature, any wavelength in the range 430 nm to 470 nm can be generated.

The infrared to blue conversion efficiency (total blue output power/intracavity travelling power) is measured using a power meter (United Detector Technology Inc. 80×Opto-meter). From the maximum power of the fundamental of 14 Kw, a total blue output power of 7.8 Kw is obtained, giving an efficiency of 45%.

As can be seen, an efficient intracavity frequency doubling of a pulsed $Ti:Al_2O_3$ laser using $KNbO_3$ *as the non-linear crystal has been shown.*

What is claimed is:

1. A single domain crack-free and striation-free $KNbO_3$ crystal, having a maximum iron content of 15 ppm.

2. A crystal according to claim 1 having an iron content of 2 ppm to 15 ppm.

3. A crystal according to claim 2 having a hardness of about 5 Mohs.

4. A crystal according to claim 3 having a density of about 4.62 g/cm$^3$ and lattice parameters of a $= 5.6895 \times 10^{-10}$m, b $= 3.9692 \times 10^{-10}$m and c $= 5.7256 \times 10^{-10}$m.

5. A crystal according to claim 1 having a hardness of about 5 Mohs.

6. A crystal according to claim 1 having lattice parameters of a $= 5.6896 \times 10^{-10}$m, b $= 3.9692 \times 10^{-10}$m and c $= 5.7256 \times 10^{-10}$m.

7. A crystal according to claim 1 having a density of about 4.62 g/m$^3$.

8. A process for the preparation of a crystal according to claim 1 comprising the steps of
   (a) (i) mixing in a water-free system anhydrous $K_2CO_3$ and $Nb_2O_5$, the mixture consisting of 50.5 to 54 mol percent of anhydrous $K_2CO_3$ and 46 to 49.5 mol percent of $Nb_2O_5$,
   (ii) sintering the resulting mixture at a temperature of 750°-850° C., and
   (iii) heating the sintered mixture to melt it to form a molten flux seeding solution,
   (b) (i) seeding the molten flux seeding solution, and
   (ii) growing a crystal from the seeded molten flux seeding solution, and
   (c) polishing the resultant crystal.

9. A process according to claim 8 wherein step (a) comprises
   (i) mixing in a water-free system anhydrous $K_2CO_3$ and $Nb_2O_5$ in powdered form, the mixture consisting of 50 mol percent of anhydrous $K_2CO_3$ and 50 mol percent of $Nb_2O_5$, and homogenizing the mixture,
   (ii) sintering the resulting mixture at 750°-850° C.,
   (iii) crushing the resulting sintered mixture into powdered form and homogenizing the resulting powder, (iv) mixing the resulting homogenized powder with excess anhydrous $K_2CO_3$ such that the resulting mixture consists of 50.5–54 mol percent of anhydrous $K_2CO_3$ and 46–49.5 mol percent of $Nb_2O_5$ and sintering the resulting mixture, (v) crushing the resulting sintered material into powdered form, and (vi) pouring the resulting powdered mixture into an inert container and heating the mixture to its melting point or to a temperature just above its melting point to form a molten flux seeding solution.

10. A process according to claim 8 wherein step (b) comprises (i) inserting, while rotating, a $KNbO_3$ seed crystal having the (110) or (100) orientation into the upper region of the molten flux seeding solution and regulating the temperature of the molten flux seeding solution so that the weight of the growing crystal does not increase by more than 0.1 g over the initial 6 to 12 hours, (ii) changing the temperature of the molten flux seeding solution so as to cause the growing crystal to be drawn at a crystal growth rate of not more than 0.5 mm per hour, and (iii) when the growing crystal reaches the desired weight, withdrawing it from direct contact with the molten flux seeding solution and cooling it to room temperature at a constant temperature gradient.

11. A process according to claim 8 wherein step (c) comprises (i) grinding each of the surfaces of the crystal, (ii) immersing the ground crystal in 30% liquid hydrofluoric acid at 80° C. for 1 hour, (iii) washing the hydrofluoric acid-treated crystal in cold water, (iv) where necessary, orienting the b-surfaces of the crystal to remove any spontaneous polarization thereon caused by grinding, (v) grinding the surfaces of the crystal again and reorienting the surfaces of the crystal to remove any spontaneous polarization thereon, (vi) cutting the resulting crystal to the desired size, (vii) grinding the a- and c-surfaces of the crystal again, (viii) surface grinding the a- and b-surfaces to maximum transparency, and (ix) submerging the resulting crystal in an inert liquid or gas, heating the inert liquid or gas to 120°–200° C., applying a 0.5 to 5 KV/cm field to the c-surfaces of the crystal to remove any domains resulting from grinding and very finely polishing each surface of the crystal.

12. A laser system for converting green light of wavelength 500–540 nm into blue light of wavelength 430–470 nm comprising a single domain substantially crack-free and striation-free $KNbO_3$ crystal.

13. A laser system according to claim 12 wherein the laser system is in a single cavity or container.

14. A laser system according to claim 12 wherein the $KNbO_3$ crystal is a single domain crack-free and striation-free $KNbO_3$ crystal having a maximum iron content of 15 ppm.

15. A laser system according to claim 14 wherein the $KNbO_3$ crystal has an iron content of 2 ppm to 15 ppm.

16. A laser system according to claim 15 wherein the lattice parameters of the $KNbO_3$ crystal are $a=5.6896\times10^{-10}$m, $b=3.9692\times10^{-10}$m and $c=5.7256\times10^{-10}$m and the $KNbO_3$ crystal has a hardness of about 5 Mohs and a density of about 4.62 g/cm$^3$.

17. A laser system according to claim 14 wherein the $KNbO_3$ crystal has a hardness of about 5 Mohs.

18. A laser system according to claim 14 wherein the lattice parameters of the $KNbO_3$ crystal are $a=5.6896\times10^{-10}$m, $b=3.9692\times10^{-10}$m and $c=5.7256\times10^{-10}$m.

19. A laser system according to claim 14 wherein the $KNbO_3$ crystal has a density of about 4.62 g/cm$^3$.

20. A laser system according to claim 12 comprising (i) a Ti:$Al_2O_3$ crystal-containing pumped laser which converts green light having a wavelength of 500–540 nm into infra-red light having a wavelength of 860–940 nm, (ii) means for introducing green light into the Ti:$Al_2O_3$ crystal, (iii) downstream of the Ti:$Al_2O_3$ crystal, a single domain crack-free and striation-free $KNbO_3$ crystal, said $KNbO_3$ crystal being located in an oven for heating the crystal for phase matching of the second harmonic with its fundamental, and (iv) means for introducing only infra-red light of a specified wavelength from the Ti:$Al_2O_3$ crystal into the $KNbO_3$ crystal where the infra-red light is converted to blue light having a wavelength of 430–470 nm by frequency doubling.

* * * * *